United States Patent
Taylor et al.

(10) Patent No.: US 10,910,858 B2
(45) Date of Patent: *Feb. 2, 2021

(54) SYSTEMS AND METHODS FOR SERIES BATTERY CHARGING

(71) Applicant: 24M Technologies, Inc., Cambridge, MA (US)

(72) Inventors: Tony L. Taylor, Hampton, NH (US); Naoki Ota, Lexington, MA (US); Taison Tan, Cambridge, MA (US)

(73) Assignee: 24M Technologies, Inc., Cambridge, MA (US)

( * ) Notice: Subject to any disclaimer, the term of this patent is extended or adjusted under 35 U.S.C. 154(b) by 0 days.

This patent is subject to a terminal disclaimer.

(21) Appl. No.: 16/789,158

(22) Filed: Feb. 12, 2020

(65) Prior Publication Data

US 2020/0259338 A1 Aug. 13, 2020

Related U.S. Application Data

(63) Continuation of application No. 16/180,946, filed on Nov. 5, 2018, now Pat. No. 10,601,239, which is a
(Continued)

(51) Int. Cl.
*H02J 7/00* (2006.01)
*H01M 10/46* (2006.01)
(Continued)

(52) U.S. Cl.
CPC ........... *H02J 7/007* (2013.01); *H01M 4/0447* (2013.01); *H01M 10/049* (2013.01);
(Continued)

(58) Field of Classification Search
CPC ....................................................... H02J 7/007
(Continued)

(56) References Cited

U.S. PATENT DOCUMENTS 6,060,864 A * 5/2000 Ito ..................... G01R 19/16542
320/136
7,002,265 B2 * 2/2006 Potega ................ H02J 7/00041
307/149
(Continued)

FOREIGN PATENT DOCUMENTS

GB 1393726 5/1975
JP 2002-078229 A 3/2002
(Continued)

OTHER PUBLICATIONS

Office Action for U.S. Appl. No. 14/879,599, dated Oct. 10, 2017, 9 pages.
(Continued)

*Primary Examiner* — Yalkew Fantu
(74) *Attorney, Agent, or Firm* — Cooley LLP (57) ABSTRACT

Systems and methods for charging and discharging a plurality of batteries are described herein. In some embodiments, a system includes a battery module, an energy storage system electrically coupled to the battery module, a power source, and a controller. The energy storage system is operable in a first operating state in which energy is transferred from the energy storage system to the battery module to charge the battery module, and a second operating state in which energy is transferred from the battery module to the energy storage system to discharge the battery module. The power source electrically coupled to the energy storage system and is configured to transfer energy from the power source to the energy storage system based on an amount of stored energy in the energy storage system. The controller is operably coupled to the battery module and is configured to monitor and control a charging state of the battery module.

20 Claims, 7 Drawing Sheets

Related U.S. Application Data continuation of application No. 14/879,599, filed on Oct. 9, 2015, now Pat. No. 10,153,651.

(60) Provisional application No. 62/063,167, filed on Oct. 13, 2014.

(51) Int. Cl.
| | | |
|---|---|---|
| *H01M 10/44* | (2006.01) | |
| *H01M 10/04* | (2006.01) | |
| *H01M 10/42* | (2006.01) | |
| *H01M 4/04* | (2006.01) | |
| *H01M 10/28* | (2006.01) | |
| *H01M 10/12* | (2006.01) | |

(52) U.S. Cl.
CPC ..... *H01M 10/288* (2013.01); *H01M 10/4264* (2013.01); *H01M 10/441* (2013.01); *H01M 10/446* (2013.01); *H01M 10/46* (2013.01); *H02J 7/00* (2013.01); *H02J 7/0014* (2013.01); *H02J 7/0021* (2013.01); *H02J 7/0029* (2013.01); *H02J 7/0047* (2013.01); *H01M 10/128* (2013.01); *H02J 7/0049* (2020.01)

(58) Field of Classification Search
USPC ............................................ 320/134
See application file for complete search history.

(56) References Cited

U.S. PATENT DOCUMENTS

| | | | |
|---|---|---|---|
| 7,734,317 B2 * | 6/2010 | Patel | H02J 7/0013 320/129 |
| 8,722,226 B2 | 5/2014 | Chiang et al. | |
| 8,722,227 B2 | 5/2014 | Chiang et al. | |
| 8,778,552 B2 | 7/2014 | Chiang et al. | |
| 8,993,159 B2 | 3/2015 | Chiang et al. | |
| 9,153,833 B2 | 10/2015 | Chiang et al. | |
| 9,178,200 B2 | 11/2015 | Bazzarella et al. | |
| 9,184,464 B2 | 11/2015 | Chiang et al. | |
| 9,203,092 B2 | 12/2015 | Slocum et al. | |
| 9,293,781 B2 | 3/2016 | Chiang et al. | |
| 9,362,583 B2 | 6/2016 | Chiang et al. | |
| 9,385,392 B2 | 7/2016 | Chiang et al. | |
| 9,401,501 B2 | 7/2016 | Bazzarella et al. | |
| 9,437,864 B2 | 9/2016 | Tan et al. | |
| 9,484,569 B2 | 11/2016 | Doherty et al. | |
| 9,583,780 B2 | 2/2017 | Chiang et al. | |
| 9,614,231 B2 | 4/2017 | Carter et al. | |
| 9,786,944 B2 | 10/2017 | Chiang et al. | |
| 9,812,674 B2 | 11/2017 | Bazzarella et al. | |
| 9,825,280 B2 | 11/2017 | Chiang et al. | |
| 9,831,518 B2 | 11/2017 | Chiang et al. | |
| 9,831,519 B2 | 11/2017 | Chiang et al. | |
| 9,831,522 B2 | 11/2017 | Tan et al. | |
| 10,115,970 B2 | 10/2018 | Ota et al. | |
| 10,122,044 B2 | 11/2018 | Tan et al. | |
| 10,153,651 B2 | 12/2018 | Taylor et al. | |
| 10,181,587 B2 | 1/2019 | Ota et al. | |
| 10,230,128 B2 | 3/2019 | Chiang et al. | |
| 10,236,518 B2 | 3/2019 | Chiang et al. | |
| 10,411,310 B2 | 9/2019 | Chiang et al. | |
| 10,483,582 B2 | 11/2019 | Chiang et al. | |
| 10,497,935 B2 | 12/2019 | Ota et al. | |
| 10,522,870 B2 | 12/2019 | Tan et al. | |
| 10,566,581 B2 | 2/2020 | Bazzarella et al. | |
| 10,566,603 B2 | 2/2020 | Slocum et al. | |
| 10,593,952 B2 | 3/2020 | Ota et al. | |
| 10,601,239 B2 | 3/2020 | Taylor et al. | |
| 10,637,038 B2 | 4/2020 | Zagars et al. | |
| 10,734,672 B2 | 8/2020 | Chen et al. | |
| 10,777,852 B2 | 9/2020 | Woodford et al. | |
| 2001/0000423 A1 * | 4/2001 | Fischer | H02J 7/0031 320/114 |
| 2005/0035741 A1 * | 2/2005 | Elder | H01M 10/4207 320/116 |
| 2006/0152224 A1 | 7/2006 | Kim et al. | |
| 2009/0115252 A1 * | 5/2009 | Caraghiorghiopol | H02J 1/102 307/48 |
| 2010/0047671 A1 | 2/2010 | Chiang et al. | |
| 2010/0097033 A1 * | 4/2010 | Tange | H02J 7/0026 320/116 |
| 2010/0164437 A1 | 7/2010 | McKinley et al. | |
| 2010/0323264 A1 | 12/2010 | Chiang et al. | |
| 2011/0189520 A1 | 8/2011 | Carter et al. | |
| 2011/0200848 A1 | 8/2011 | Chiang et al. | |
| 2011/0274948 A1 | 11/2011 | Duduta et al. | |
| 2012/0164499 A1 | 6/2012 | Chiang et al. | |
| 2013/0055559 A1 | 3/2013 | Slocum et al. | |
| 2013/0065122 A1 | 3/2013 | Chiang et al. | |
| 2013/0309547 A1 | 11/2013 | Bazzarella et al. | |
| 2013/0320768 A1 | 12/2013 | Fujimatsu | |
| 2013/0337319 A1 | 12/2013 | Doherty et al. | |
| 2014/0004437 A1 | 1/2014 | Slocum et al. | |
| 2014/0030623 A1 | 1/2014 | Chiang et al. | |
| 2014/0039710 A1 | 2/2014 | Carter et al. | |
| 2014/0154546 A1 | 6/2014 | Carter et al. | |
| 2014/0170524 A1 | 6/2014 | Chiang et al. | |
| 2014/0248521 A1 | 9/2014 | Chiang et al. | |
| 2014/0315097 A1 | 10/2014 | Tan et al. | |
| 2015/0024279 A1 | 1/2015 | Tan et al. | |
| 2015/0129081 A1 | 5/2015 | Chiang et al. | |
| 2015/0140371 A1 | 5/2015 | Slocum et al. | |
| 2015/0171406 A1 | 6/2015 | Bazzarella et al. | |
| 2015/0280267 A1 | 10/2015 | Chiang et al. | |
| 2015/0295272 A1 | 10/2015 | Chiang et al. | |
| 2015/0357626 A1 | 12/2015 | Holman et al. | |
| 2016/0013507 A1 | 1/2016 | Chiang et al. | |
| 2016/0056490 A1 | 2/2016 | Chiang et al. | |
| 2016/0056491 A1 | 2/2016 | Chiang et al. | |
| 2016/0105042 A1 | 4/2016 | Taylor et al. | |
| 2016/0126543 A1 | 5/2016 | Ota et al. | |
| 2016/0133916 A1 | 5/2016 | Zagars et al. | |
| 2016/0190544 A1 | 6/2016 | Slocum et al. | |
| 2016/0218375 A1 | 7/2016 | Chiang et al. | |
| 2016/0268621 A1 | 9/2016 | Chiang et al. | |
| 2016/0308218 A1 | 10/2016 | Ota et al. | |
| 2016/0344006 A1 | 11/2016 | Ota et al. | |
| 2016/0372802 A1 | 12/2016 | Chiang et al. | |
| 2017/0018798 A1 | 1/2017 | Tan et al. | |
| 2017/0025646 A1 | 1/2017 | Ota et al. | |
| 2017/0025674 A1 | 1/2017 | Tan et al. | |
| 2017/0033389 A1 | 2/2017 | Chiang et al. | |
| 2017/0033390 A1 | 2/2017 | Chiang et al. | |
| 2017/0077464 A1 | 3/2017 | Bazzarella et al. | |
| 2017/0162863 A1 | 6/2017 | Doherty et al. | |
| 2017/0214034 A1 | 7/2017 | Ota et al. | |
| 2017/0237111 A1 | 8/2017 | Holman et al. | |
| 2017/0237112 A1 | 8/2017 | Holman et al. | |
| 2017/0288281 A1 | 10/2017 | Chiang et al. | |
| 2018/0034090 A1 | 2/2018 | Chiang et al. | |
| 2018/0175428 A1 | 6/2018 | Chiang et al. | |
| 2018/0175445 A1 | 6/2018 | Tan et al. | |
| 2018/0233708 A1 | 8/2018 | Bazzarella et al. | |
| 2018/0233722 A1 | 8/2018 | Holman et al. | |
| 2018/0287220 A1 | 10/2018 | Woodford et al. | |
| 2019/0036101 A1 | 1/2019 | Tyler et al. | |
| 2019/0058184 A1 | 2/2019 | Bazzarella et al. | |
| 2019/0245242 A1 | 8/2019 | Tan et al. | |
| 2019/0319460 A1 | 10/2019 | Taylor et al. | |
| 2019/0326562 A1 | 10/2019 | Ota et al. | |
| 2019/0348705 A1 | 11/2019 | Chen et al. | |
| 2019/0355998 A1 | 11/2019 | Chiang et al. | |
| 2019/0363351 A1 | 11/2019 | Ota et al. | |
| 2019/0393477 A1 | 12/2019 | Lawrence et al. | |
| 2020/0014025 A1 | 1/2020 | Zagars et al. | |
| 2020/0044296 A1 | 2/2020 | Chiang et al. | |
| 2020/0106094 A1 | 4/2020 | Ota et al. | |
| 2020/0161688 A1 | 5/2020 | Chaing et al. | |
| 2020/0220118 A1 | 7/2020 | Bazzarella et al. | |
| 2020/0220204 A1 | 7/2020 | Tan et al. | |

(56) References Cited

U.S. PATENT DOCUMENTS

FOREIGN PATENT DOCUMENTS

| JP | 2014-193111 A | 10/2014 |
| WO | WO 2012/047596 | 4/2012 |
| WO | WO 2014/017463 | 1/2014 |
| WO | WO 2016/060955 | 4/2016 |

OTHER PUBLICATIONS

International Search Report and Written Opinion for International Application No. PCT/US2015/054911, dated Feb. 8, 2016, 10 pages.
Notice of Reasons for Rejection for Japanese Application No. 2017-517274, dated Sep. 5, 2019, 11 pages.
Decision of Rejection for Japanese Application No. 2017-517274, dated Mar. 12, 2020, 8 pages.
Extended European Search Report for European Application No. 20153991.3, dated Aug. 10, 2020, 6 pages.

\* cited by examiner

FIG. 7

SYSTEMS AND METHODS FOR SERIES BATTERY CHARGING

CROSS-REFERENCE TO RELATED APPLICATIONS

This application is a continuation of U.S. patent application Ser. No. 16/180,946, filed Nov. 5, 2018 and titled "Systems and Methods For Series Battery Charging," which is a continuation of U.S. patent application Ser. No. 14/879,599, filed Oct. 9, 2015, now U.S. Pat. No. 10,153,651, and titled "Systems and Methods For Series Battery Charging," which claims priority to and the benefit of U.S. Provisional Application No. 62/063,167, filed Oct. 13, 2014 and entitled "Systems and Methods for Series Battery Charging," the disclosures of which are hereby incorporated by reference in their entirety.

BACKGROUND

Embodiments described herein relate generally to systems and methods for charging one or more batteries, and more particularly to systems and methods for charging a plurality of batteries that are coupled together in series.

The final step in a manufacturing process of rechargeable batteries typically includes a battery formation step. Cell formation is the process of transforming the active materials of a new cell into their usable form. The initial crystal structure of the electrolyte or the electrodes is determined by the manufacturing process by which these components were made and the process of forming the electrodes, which may not be the optimum structure for minimizing the internal impedance of the cell and may not give optimum contact between the electrolyte and the electrodes. The passage of current through the cell, and the heating and cooling of the cell, causes small changes in the microstructure or morphology of the active chemicals, and creates a stable solid electrolyte interface (SEI) that can passivate the electrode-electrolyte interface as well as prevent side reactions. Several cycles of charging and discharging of the batteries are usually carried out to ensure that the capacity and performance of the batteries meets the required specifications. During charging and discharging batteries are normally monitored and controlled due to the high energy density involved in the processes. Existing battery systems and modules typically have integrated voltage sensing, temperature sensing and safety control electronics. Moreover, battery module and packs are typically assembled and integrated using already formed cells.

SUMMARY

Systems and methods for charging and discharging a plurality of batteries are described herein. In some embodiments, a system includes a battery module, an energy storage system electrically coupled to the battery module, a power source, and a controller. The energy storage system is operable in a first operating state in which energy is transferred from the energy storage system to the battery module to charge the battery module, and a second operating state in which energy is transferred from the battery module to the energy storage system to discharge the battery module. The power source electrically coupled to the energy storage system and is configured to transfer energy from the power source to the energy storage system based on an amount of stored energy in the energy storage system. The controller is operably coupled to the battery module and is configured to monitor and control a charging state of the battery module.

DETAILED DESCRIPTION

Systems and methods for charging and discharging a plurality of batteries are described herein. In some embodiments, a system includes a battery module, an energy storage system electrically coupled to the battery module, a power source, and a controller. The energy storage system is operable in a first operating state in which energy is transferred from the energy storage system to the battery module to charge the battery module, and a second operating state in which energy is transferred from the battery module to the energy storage system to discharge the battery module. The power source electrically coupled to the energy storage system and is configured to transfer energy from the power source to the energy storage system based on an amount of stored energy in the energy storage system. The controller is operably coupled to the battery module and is configured to monitor and control a charging state of the battery module. In some embodiments, the battery module can include a plurality of batteries connected in series. In some embodiments, the system can further include a cell fixture configured to connect a plurality of batteries in series.

In some other embodiments, a battery formation method includes transferring energy from an energy storage system to a first battery module to charge the first battery module, monitoring a charging state of the first battery module with a first controller operably coupled to the first battery module, transferring energy from the first battery module to the energy storage system to discharge the first battery module, transferring energy from the energy storage system to the second battery module to charge the second battery module, and monitoring a charging state of the second battery module with a second controller operably coupled to the second battery module. In some embodiments, the formation method can further include monitoring an amount of stored energy in the energy storage system, and transferring energy from a power source to the energy storage system if the amount of stored energy falls below a threshold value. In some embodiments, energy is transferred from the energy storage system to the first battery module during a first time period, energy is transferred from the first battery module during a second time period, and energy is transferred from the energy storage system to the second battery module during a third time period. At least a portion of the first time period can be concurrent with at least a portion of the third time period. At least a portion of the second time period can be concurrent with at least a portion of the third time period.

As used in this specification and the appended claims, the singular forms "a," "an" and "the" include plural referents unless the context clearly dictates otherwise. Thus, for example, the term "a member" is intended to mean a single member or a combination of members, "a material" is intended to mean one or more materials, or a combination thereof.

As used herein, the term "set" can refer to multiple features or a singular feature with multiple parts. For example, when referring to set of battery modules, the set of modules can be considered as one module with distinct portions (e.g., cell fixtures, wires, connectors, etc.), or the set of modules can be considered as multiple modules. Similarly stated, a monolithically constructed item can include a set of modules. Such a set of modules can include, for example, multiple portions that are discontinuous from each other. A set of modules can also be manufactured from multiple items that are produced separately and are later joined together (e.g., via a weld, an adhesive, or any suitable method).

As used herein, the terms "about," "approximately," and "substantially" when used in connection with a numerical value is intended to convey that the value so defined is nominally the value stated. Said another way, the terms about, approximately, and substantially when used in connection with a numerical value generally include the value stated plus or minus a given tolerance. For example, in some instances, a suitable tolerance can be plus or minus 10% of the value stated; thus, about 0.5 would include 0.45 and 0.55, about 10 would include 9 to 11, about 1000 would include 900 to 1100. In other instances, a suitable tolerance can be plus or minus an acceptable percentage of the last significant figure in the value stated. For example, a suitable tolerance can be plus or minus 10% of the last significant figure; thus, about 10.1 would include 10.09 and 10.11, approximately 25 would include 24.5 and 25.5. Such variance can result from manufacturing tolerances or other practical considerations (such as, for example, tolerances associated with a measuring instrument, acceptable human error, or the like).

Rechargeable batteries or cells are typically manufactured with electronically inert chemical compounds. After the batteries are fully assembled, the electronically inert compounds are converted into electroactive species in a process known as formation (also referred to herein as "battery formation", "cell formation", and/or "module formation"). Formation is essentially the first charge carried out at the cell manufacturer's plant under carefully controlled conditions of current, temperature, and duration to create the desired microstructure of the components and the contact between them. The formation process can generally be divided into two phases. First, a constant current is applied to the cell or battery up to a predetermined voltage limit. Once the predetermined voltage limit is reached, the voltage is maintained at a constant value and the current applied trails off to a low value. The formation process can then be terminated based upon a total number of ampere-hours applied into the cell or group of cells, or based on a current limit as the charging current decreases with the internal resistance of the cell.

In conventional systems, battery formation is normally performed with one cell per channel and at slow rates such as C/10 (i.e., 1/10 of the cell's A-hr rating). The channels are usually connected with each other in parallel such that there is a constant voltage across all of the cells. This parallel arrangement can have several drawbacks. For example, it normally takes high upfront capital expenditures to build a parallel charging-discharging system since each channel in the system is independent from one another and the charging take place at such slow rates. Similarly, the independent channels can require additional ancillary components (e.g., diagnostic system, data transmission, battery control, massive amount of individual cell containers, etc.) to support and manage the large number of channels simultaneously. Furthermore, since the same voltage is applied to all batteries, it may be difficult to prevent overcharging or undercharging, therefore negatively influencing the yield of the cell manufacturing plant.

Cell formation can also be a very energy intensive process and can cause significant energy consumption issues at a cell manufacturing plant. For example, if a factory targets producing 500 MWh of battery capacity per year, the formation process alone can consume more than 500 MWh of energy per year since each battery typically undergoes at least one complete charge-discharge cycle. Said another way, the energy consumed during the charging process is typically discharged and dissipated as heat during the test of battery capacity, therefore creating energy waste. With some chemical formulations, it may take ten charge-discharge cycles or more before the battery is able to deliver its full power or capacity. Thus, the energy consumption issues can be further exacerbated by repetitive charging and discharging cycles in battery formation, or to test the battery capacity to make sure the batteries meet the specification requirements, or to sort the batteries into different categories for distribution. Thus, battery formation can be both energy intensive and capital intensive.

Figure 1:
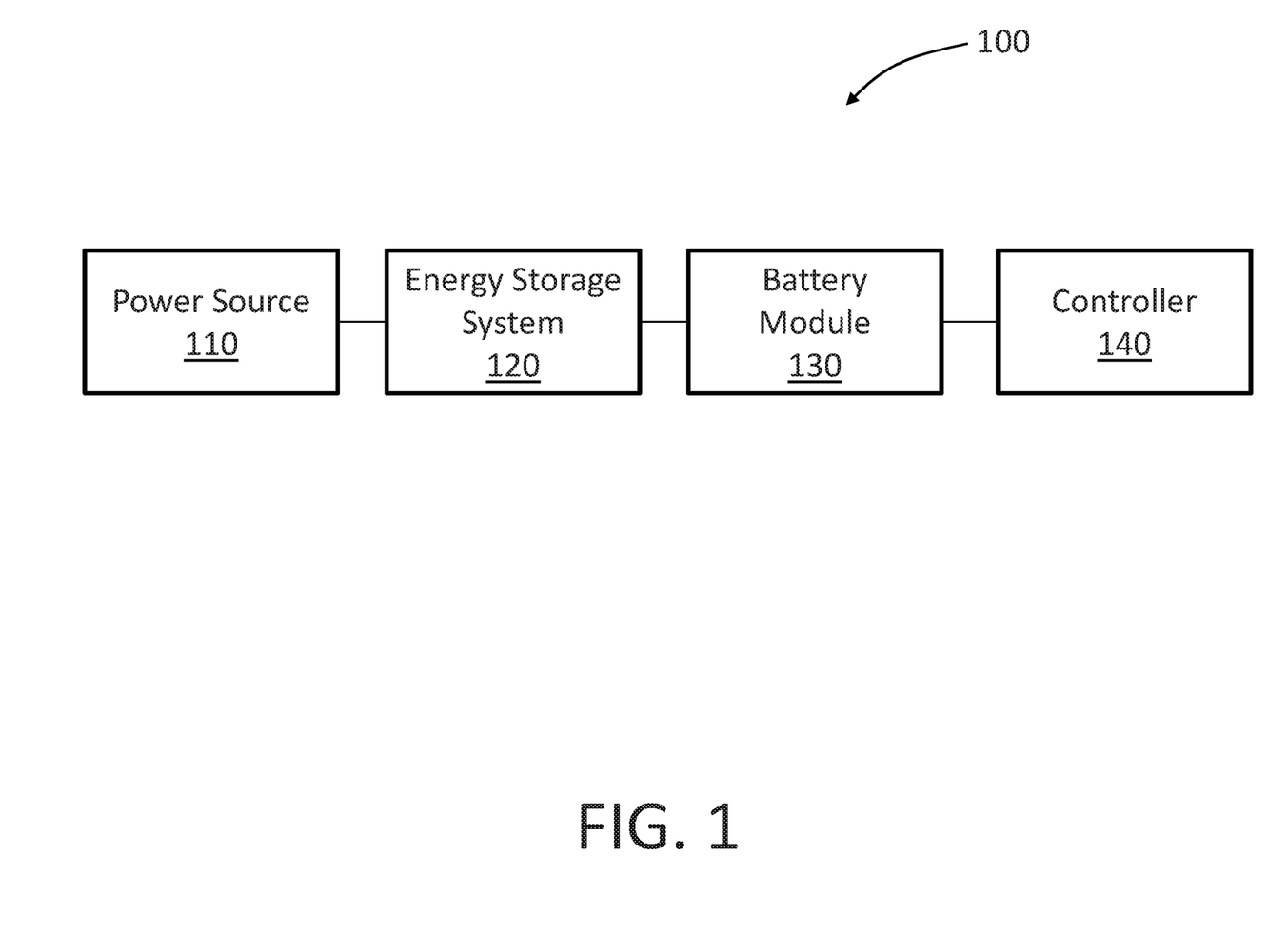
FIG. 1 is a schematic illustration of battery formation systems, according to various embodiments.

FIG. 1 shows a battery formation system that can address, at least partially, the drawbacks in conventional battery formation systems. In some embodiments, the battery formation system 100 includes a power source 110, an energy storage system 120, one or more battery modules 130, and a controller 140. The battery modules 130 can include individual cells, individual batteries, modules (e.g. a plurality of individual cells that are connected, for example, in series or parallel), or a battery pack (e.g. a plurality of modules that are connected, for example, in series or parallel) to form the module 130. For example, the battery module 130 can include 12 batteries connected in series, each of which has a specified voltage of 1.5 V, to form an 18-volt module. In another example, the battery module 130 can include four 3.6 V Li-ion cells in series to achieve 14.4 V and two strings of these 4 cells in parallel to increase the capacity, for example, from 2400 mAh to 4800 mAh.

In some embodiments, the battery modules 130 can include a cell fixture (not shown) configured to connect a plurality of cells (also referred to herein as batteries) for charging and discharging. For example, the cell fixture can be configured to connect a plurality of cells in at least three configurations. In a first configuration, the cell fixture can be configured to connect a plurality of cells in series such that a constant current is flowing across the plurality of cells to achieve a voltage that is the sum of each individual cell voltage. In a second configuration, the cell fixture is configured to connect a plurality of cells in parallel such that a constant voltage is applied across the plurality of individual cells. In this configuration, a higher current can be transferred from the battery module 130 to the energy storage system 120 during discharge. In a third configuration, the cell fixture can be configured to connect a plurality of cells in a combination of both series and parallel (also referred to as a serial/parallel configuration). In this third configuration, sets of cells are connected in series into strings, and the strings are then connected in parallel. This third "hybrid"

configuration can allow design flexibility to charge a plurality of batteries of different specifications.

In some embodiments, the cell fixtures can be replaced or supplemented by docking stations (not shown) to allow wireless charging of battery modules 130. Since electrical connectors in docking stations can be well sealed, inductive charging can be free of corrosion or hazard induced by oxygen, water, or chemicals, among others.

The energy storage system 120 is electrically coupled to the battery modules 130 and is configured to allow bi-directional transfer of energy between the energy storage system 120 and the battery modules 130. In one operating state, the energy storage system 120 is configured to transfer energy from the energy storage system 120 to the battery modules 130 to charge the battery modules 130. In a second operating state, the energy storage system 120 is configured to transfer energy from the battery modules 130 to the energy storage system 120 to discharge the battery modules 130. The energy transferred from the battery modules 130 to the energy storage system 120 can be stored for future use including, for example, recharging the battery modules 130 for battery formation or testing. Through recycling the energy from battery discharging, energy consumption for the battery formation system 100, and thus the overall battery manufacturing process, can be reduced.

In some embodiments, the energy storage system 120 can be configured to charge a plurality of battery modules 130 at substantially the same time, and then later discharge the same plurality of battery modules 130. In some embodiments, the energy storage system can be configured to charge a first battery module 130 (or a first set of battery modules 130) and discharge a second battery module 130 (or a second set of battery modules 130) at substantially the same time. The energy storage system 120 can be configured to charge and/or discharge any number of battery modules 130 at substantially the same time. Said another way, the energy storage system 120 can be electrically coupled to a plurality of individual battery modules 130, or a plurality of sets of battery modules 130, and each battery module 130 or set of modules can be charged or discharged independent of the charging state of the rest of the plurality of modules 130.

The energy storage system 120 as used in the formation system 100 can be selected from a variety of options. In some embodiments, the energy storage system 120 can include one or more arrays of rechargeable batteries such as, for example, Lithium ion (Li-ion), Nickel cadmium (NiCd), Nickel Metal Hyride (NiMH), Sealed Lead Acid (SLA), Sodium Sulfide (NAS) or any other type of rechargeable batteries known in the art. As described herein, the array of rechargeable batteries can be configured deliver energy to the battery module 130 for charging, and receive and store energy during discharge. Current technologies can produce energy storage systems 120 with an output capacity of more than 1 MWh using lithium ion cells.

In some embodiments, the energy storage system 120 can include flow batteries. Flow batteries allow the batteries' power to be decoupled from the batteries' capacity, so users can tune the batteries' specification to specific applications and situations. Flow batteries used for constructing the energy storage system 120 can be made from one or more of the following cells: Li-ion flow cells, redox cells in which electrochemical components are dissolved in the electrolyte, hybrid cells that have one or more electroactive components deposited as a solid layer, membraneless cells which employ laminar flow to undergo electrochemical reactions to store or release energy, organic cells that can use carbon-based molecules, for example, 9,10-anthraquinone-2,7-disulphonic acid (AQDS), as charge carriers, metal hydride cells which integrate a metal hydride storage electrode into a reversible proton exchange membrane fuel cell, and nano-network cells that uses lithium sulfur chemistry arranged in a network of nanoparticles. Energy storage medium in flow batteries can be, for example, Bromine-hydrogen, Iron-tin, Iron-titanium, Iron-chrome, Vanadium-vanadium (sulphate), Vanadium-vanadium (bromide), Sodium/bromine polysulfide, Zinc-bromine, Lead-acid, Zinc-cerium, or their combinations.

In some embodiments, the energy storage system 120 can include one or more electrical double-layer capacitors (EDLC), Li-ion capacitors, or hybrid capacitors, which can employ two energy storage mechanisms. The first storage mechanism can be electrostatic storage of the electrical energy achieved by separation of charge in a Helmholtz double layer at the interface between the surface of a conductor electrode and an electrolytic solution electrolyte. The separation distance in the double layer structure can be less than 1 nanometer. Additionally, the energy can be stored and released through electrochemical reactions, more specifically, redox reaction electrosorption or intercalation on the surface of the electrode by specifically absorbed ions that result in a reversible faradaic charge-transfer on the electrode.

In some embodiments, the energy storage system 120 can include a Flywheel Energy Storage (FES). In this example, the energy storage system 120 can store its electrical energy as mechanical energy (more specifically, rotational energy) by accelerating a rotor (flywheel) to a high speed, and deliver its stored energy by using the rotating flywheels to drive a power generator. Magnetic bearings can be used for the rotors to reduce friction and therefore increase energy storage efficiency. Composite materials, such as carbon-fiber composites, can be used to make the rotors to increase the strength-to-density ratio of the rotor and further increase the efficiency.

In some embodiments, the energy storage system 120 can include superconducting magnetic energy storage (SMES) to store and deliver power. The energy system 120, in this example, can comprise a superconducting coil to store the energy, a power conditioning system to coordinate the storage and release of powers, and a cooling system to cool the superconducting coil below its superconducting critical temperature. The electrical energy can be stored in a magnetic field created by the flow of direct current in the superconducting coil, which has nearly zero resistance and therefore will not decay the stored energy. Releasing the magnetic energy to either the utility grid or the battery charging module can be achieved by discharging the coil.

In some embodiments, the energy storage system 120 can include hydroelectric (e.g., pumped hydro) energy storage. Electricity can be stored by pumping water or other types of fluids to a reservoir at a higher elevation, and the stored energy can later be released by using the fluids to drive a power generator, similar to power generation in a hydropower plant.

In some embodiments, the energy storage system 120 can include thermoelectric energy storage (TEES). For instance, the energy storage system 120 can use the electricity to heat up a fluid (e.g., oil), which can be maintained at a high temperature with low thermal losses. When energy release is needed, the heated fluid can drive a steam turbine, a gas turbine or similar to generate electricity, similar to power generation in a fuel power station.

In some embodiments, the energy storage system 120 can include compressed air energy storage (CAES). For example, the energy storage system 120 can use a compressor to pressurize air and pump the compressed air into storage caverns or tanks. When energy is needed, the compressed air can be released, (optionally) heated, and forced through a turbine to generate power. The heat generated during compression can be stored and used during expansion to further increase the storage efficiency. The CAES system can operate in several modes, including adiabatic mode, diabatic mode, and isothermal mode, as readily understood in the art.

In some embodiments, the energy storage system 120 can be a hybrid system that combines more than one types of energy storage schemes mentioned above. For example, the energy storage system 120 can include a battery system and fuel cells.

The power source 110 is electrically coupled to the energy storage system 120 and is configured to transfer energy from the power source to the energy storage system based on an amount of stored energy in the energy storage system. For example, the power source 110 can provide start-up energy for the energy storage system 120 to initiate the charging and discharging cycles in which this start-up energy is recycled. Moreover, when the amount of energy available in the energy storage system 120 drops below a threshold level during charging and discharging cycles, the power source 110 can be configured to transfer supplemental energy to the energy storage system 120 to ensure proper operation of the formation system 100. Said another way, the power source 110 can compensate for energy losses in the energy storage system 120. For example, an energy storage system 120 comprising rechargeable battery arrays may lose part of the energy storage through heat generation and dissipation. In another example, an energy storage system 120 including flywheel energy storage (FES) may need make-up power to compensate energy losses due to friction of the flywheels.

In some embodiments, energy transfer between the power source 110 and the energy storage system 120 can be configured to be bi-directional. For example, if the power source 110 is a utility power grid, the energy storage system 120 may use its stored energy to provide power to the grid during peak hours of energy use, and then receive "make-up" power during off-peak hours. Said another way, the energy storage system 120 can be used for power grid load balancing. In another example, the energy storage system 120 can function as a backup power supply by extracting energy from the batteries during unexpected power outage or during other emergencies.

In some embodiments, energy transfer between the power source 110 and the energy storage system 120 can be configured to be unidirectional. For example, if the power source 110 is an intermittent power supply (e.g., renewable energy generation such as solar, wind, etc.), it may not be possible to employ bidirectional energy transfer. However, in some embodiments, the energy storage system 120 can be electrically coupled to multiple power sources 110 (e.g., solar, wind, and a utility grid) to utilize renewable power when available, utilize utility grid power when the renewable supply is not available, and even to store and transfer (e.g., balance) renewable energy when production is greater than demand (e.g. when the wind is blowing at night in the case of wind turbines).

The controller 140 is operably coupled to the battery module 130 and is configured to monitor and control a charging state of the battery module. Moreover, the controller 140 can also be operably coupled to the energy storage system 120 and configured to monitor and control a charging state of the energy storage system.

In some embodiments, the controller 140 can be configured to monitor and control charging states at each level of the system 100. On a system level, the controller 140 can coordinate the system 100 with external components, such as public utilities. For example, the controller 140 can determine when and where to send its stored energy. On a module level, the controller 140 can coordinate the operation among, for example, the battery module 130, the energy storage system 120, and the power source 110. The controller 140 can also adjust the timing of charging or discharging, which battery module to be charged or discharged, or how much energy to be stored or released, among others. On a battery level, the controller 140 can regulate each battery to, for example, detect bad or outlier cells, balance cells, or connect/disconnect selected batteries, among others, therefore optimizing the battery formation process. As used herein, an outlier cell is a cell that acts differently from other cells during charge and/or discharge (for example, cannot be charged and/or discharged, or charges and/or discharges at a different rate than other cells).

In some embodiments, the controller 140 can include two functional units: a diagnostic unit (not shown) and a control unit (not shown) to monitor and control the charging states, respectively. Charging states that can be monitored and/or controlled by the controller 140 can include voltage, temperature, state of charge, state of health, coolant flow, and current, among others. The diagnostic unit can acquire charging states via several methods. For example, in a chemical method, charging states can be derived from the specific gravity or pH value of the electrolyte. In a voltage method, the voltage of the battery can be measured and converted to state of charge, using discharge curve of the battery. Similarly, measuring the battery current and integrating the measured current data in time can also provide information on the charging state, as in a current integration method, also known as a coulomb counting method. A Kalman filter can be used to enhance the accuracy of the voltage method and the current integration method by interpreting the raw data in a more accurate way. For some types of batteries, such as NiMH batteries, internal pressure increases as the batteries are charged, therefore allowing the derivation of charging states based on the internal pressure, as in a pressure method.

In some embodiments, the charging states acquired by the diagnostic unit of the controller 140 can be used to generate control signals in order for the control unit of the controller 140 to make corresponding adjustments. For example, a higher than average voltage on certain cells may indicate potential overcharging and can prompt the control unit to disconnect the cells for a while. In another example, a temperature out of a predetermined range may indicate low charging efficiency or potential hazard, in which case the control unit can act accordingly to bring the temperature back to the preset range.

In some embodiments, the control unit can also adjust charging states based on an external signal. For instance, when the energy storage system 120 functions as a backup energy source, the controller 140 can switch ongoing charging cycles to discharging cycles during unexpected power outages. In operation, the controller 140 can be integrated with computer software to receive and analyze control signals from both inside and outside the system 100 and achieve automated operation.

In some embodiments, the controller 140 can take advantage of existing battery management systems (BMS) to monitor and control charging states of the batteries. The BMS, as used in the controller 140, can include one or more of the following modules: cell protection, charge control, demand management, state of charge (SOC) determination, state of health (SOH) determination, cell balancing, history log, and communication, among others.

In some embodiments, the controller 140 can include a cell protection module to address one or more of the following undesirable events or conditions: excessive current during charging or discharging, short circuit, over voltage (charging), under voltage (exceeding preset depth of discharge limits), high ambient temperature, overheating (exceeding the cell temperature limit), pressure build-up inside the cell, system isolation in case of accident and abuse. The cell protection module can provide useful monitoring and control to protect the cells from out-of-tolerance ambient or operating conditions and to protect the user from the consequences of battery failures. The protection can be achieved by, in a first example, thermal fuses which may shut down the battery when the ambient temperature exceeds a preset limit. In a second example, thermistors can be used to adjust their resistance in response to temperature changes. In a third example, resettable fuses can be used to provide on-battery over-current protection and reset themselves once fault conditions are removed.

In some embodiments, the controller 140 can include a charge control module, which can configure and implement charging schemes for the batteries. This charge control unit can be especially helpful for battery formation and/or testing that takes more than one charging and discharging cycles. The controller 140 can be configured to realize at least the following charging schemes: constant voltage charging, constant current charging, taper current charging, pulsed charging, burp charging (also referred to as reflex charging or negative pulse charging), IUI charging, trickle charging, float charging, random charging, among others.

In some embodiments, the controller 140 can be configured to implement a constant voltage charging scheme, in which the batteries are charged by a constant voltage until a preset state of charge is reached. Similarly, the controller 140 can be configured to implement a constant current charging scheme, which applies a constant current flow across the batteries for charging until the batteries reach a preset state of charge. Furthermore, the controller 140 can be configured to implement a taper current charging scheme, which utilizes a crude unregulated constant voltage source for charging and the current diminishes as the cell voltage builds up.

In some embodiments, the controller 140 can be configured to implement a pulsed charging scheme, which feeds the charge current to the battery in pulses. The charging rate (based on the average current) can be precisely controlled by varying the width of the pulses, typically about one second. During the charging process, short rest periods of 20 to 30 milliseconds between pulses can allow the chemical actions in the battery to stabilize by equalizing the reaction throughout the bulk of the electrode before recommencing the charge. This may also allow the chemical reaction in the batteries to keep pace with the rate of inputting the electrical energy.

In some embodiments, the controller 140 can be configured to implement a burp charging scheme, which usually applies a very short discharge pulse, typically 2 to 3 times the charging current for 5 milliseconds, during the charging rest period to depolarize the cell. These pulses can dislodge gas bubbles built up on the electrodes during fast charging, therefore speeding up the stabilization process and hence the overall charging process. The release and diffusion of the gas bubbles is known as "burping".

In some embodiments, the controller 140 can be configured to implement an IUI charging scheme. In a typical IUI charging scheme, the battery is first charged at a constant (I) rate until the cell voltage reaches a preset value—normally a voltage near to that at which gassing occurs. This first part of the charging cycle is known as the bulk charge phase. When the preset voltage has been reached, the charging switches into the constant voltage (U) phase and the current drawn by the battery gradually drops until it reaches another preset level. This second part of the cycle completes the normal charging of the battery at a slowly diminishing rate. Finally, the charging switches again back to the constant current mode (I) and the voltage continues to rise up to a new and higher preset limit, at which point the charging is terminated. This last phase is used to equalize the charge on the individual cells in the battery to maximize battery life.

In some embodiments, the controller 140 can be configured to implement a trickle charging scheme, which can compensate for the self-discharge of the battery. The charge rate can vary according to the frequency and amplitude of discharge. In some applications the charging can be designed to switch to trickle charging mode when the battery is fully charged.

In some embodiments, the controller 140 can be configured to implement a float charging scheme, in which the battery and the load are permanently connected in parallel across the DC charging source and held at a constant voltage below the battery's upper voltage limit. This method can be used for emergency power back up systems.

In some embodiments, the controller 140 can be configured to implement a random charging mode, in which the charge of the battery is in some random and/or uncontrolled way. This method can apply to certain energy storage systems 120 which stores electrical energy as mechanical energy (e.g., flywheel energy storage) and deliver its stored energy at a rate depending on the wheel speed. This method can also be used when the power source 110 is, for example, a solar power plant which normally provides energy when the sun is shining.

In some embodiments, the controller 140 can be configured to implement more than one charging schemes in order to improve the charging efficiency. For example, constant voltage charging may be followed by a trickle charging to compensate spontaneous discharge of batteries. Or, the power source 110 can comprise both solar power plant and utility grids, therefore potentially rendering a combination of constant voltage charging and random charging advantageous.

In some embodiments, the controller 140 can include a demand management module to optimize energy consumption and reduce disruption of the battery formation or testing procedures. For example, the controller 140 can be configured to reduce the overall power consumption by supplying power only to parts of the circuit which have an immediate demand for it and slowing down, or switching off the power to, circuits which may be temporarily idle.

In some embodiments, the controller 140 can include a state of charge (SOC) module. Without being bound by any theory or mode of operation, state of charge (SOC) can be defined as the available capacity expressed as a percentage of some references, which can be, for example, the rated capacity or current capacity. Knowing the amount of energy left in a battery can provide one basis for regulating the charging of the battery.

In some embodiments, the controller can include a state of health (SOH) module. State of health (SOH) can be defined as a measure of a battery's capability to deliver its specified output. Knowing the SOH can be especially helpful for assessing the readiness of emergency power output. However, SOH can be a subjective measure in that different people derive it from different measurable battery performance parameters. SOH can be estimation rather than a measurement. Accordingly, a consistent set of rules may be helpful in making the estimation more meaningful. For example, the SOH can be estimated using cell impedance or conductance as the reference.

In some embodiments, the controller 140 can include a cell balancing module. In multi-cell battery chains, or multi-battery modules, small differences between cells due to production tolerances or operating conditions tend to be magnified with each charging and discharging cycle. For example, weaker cells become overstressed during charging, causing them to become even weaker, until they eventually fail. Cell balancing is one method of maximizing the capacity of weaker cells by slowing the charge of stronger cells in the chain.

The controller 140 can be configured to realize cell balancing through several schemes, including active balancing, passive balancing, charge shunting, charge limiting, and lossless balancing, among others. Active cell balancing can remove charge from one or more high cells and deliver the charge to one or more low cells, therefore realizing cell equalization. Passive balancing techniques find the cells with the highest charge in the pack, indicated by the higher cell voltage, and remove excess energy through a bypass resistor until the voltage or charge matches the voltage on the weaker cells. In a charge shunting method, once the rated voltage on a cell has been reached, the full current bypasses the fully charged cell until the weaker cells reach full voltage. This can be fast and allow maximum storage. Charge limiting method in cell balancing switches off the charging system when the first cell reaches the preset voltage. This method can protect the cells but can also terminate the charging before all of the cells have reached full charge.

In some embodiments, the cell balancing module can include computer software which, for example, increases the rest periods of cells with a higher SOC until the others catch up, thus avoiding overcharge. During discharging, however, the rest periods can be increased for cells with a lower SOC, thus avoiding over-discharging. Since there is no excess charge to dissipate, the method can be lossless.

In some embodiments, the controller 140 can include a history log module to provide history data on the performance of each battery, therefore specifying the state of health in a more accurate way. In addition to the number of charge-discharge cycles completed by the battery, extreme operating conditions experienced by the battery can also be recorded to depict a more comprehensive picture of the battery performance. From this data, a figure representing the SOH can be determined by using a weighted average of the measured parameters. Battery usage (or abusage) data can also be stored in memory and downloaded when required.

In some embodiments, the controller 140 can include a communication module to, for example, monitor performance, log data, set system parameters, or carry system control signals, among others. The communication module can transport signals through RS232 connection, EIA-485 connection, Inter-Integrated Circuit ($I^2C$) bus, universal series bus (USB), controller area network (CAN) bus, local management network (LIN) bus, FlexRay bus, system management (SM) bus, or their combinations.

In some embodiments, the above mentioned modules (cell protection, charge control, demand management, state of charge (SOC) determination, state of health (SOH) determination, cell balancing, history log, and communication) apply equally to discharging processes. For example, the controller 140 can detect batteries having a depth of discharge (DOD) larger than a preset value, and isolate the batteries to avoid over-discharge. In another example, the charge control module of the controller 140 can also implement various discharging schemes, such as constant voltage, constant current, taper current, by adjusting external load circuits.

In some embodiments, the above mentioned modules in the controller 140 can be operably coupled to other components in the battery formation system 100, including the energy storage system 120 and the power source 110, so as to optimize the operation of the entire battery formation system 100. For example, the demand management module of the controller 140 can coordinate the energy transfer between the energy storage system 120 and external energy demand, streamlining the operation of both battery formation and energy backup.

Figure 2:
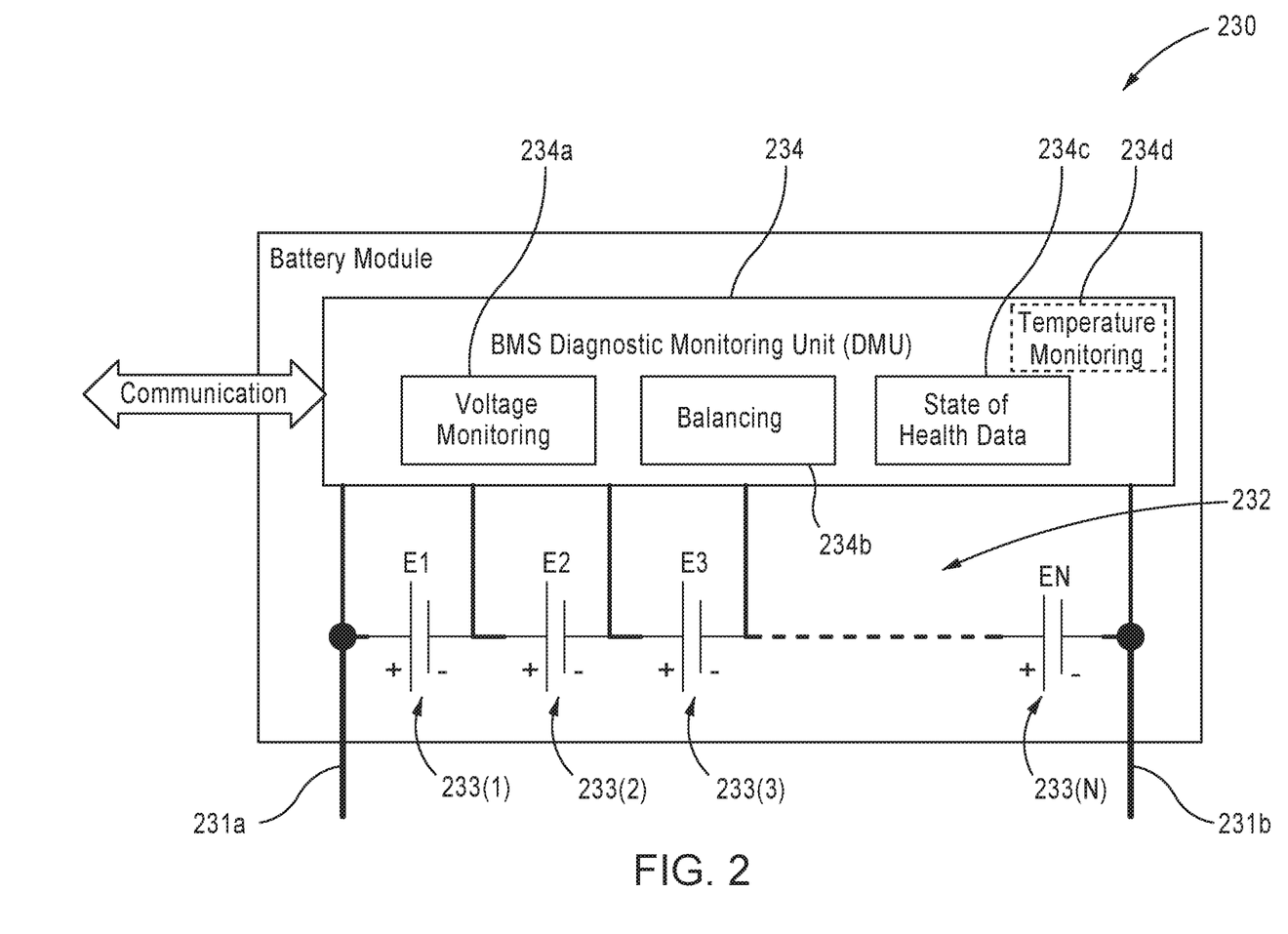
FIG. 2 shows battery modules that can be used in a battery formation system like the one shown in FIG. 1.

Referring now to FIG. 2, a battery module 230 is shown that can be used in a battery formation system (e.g., battery formation system 100) according to one exemplary embodiment. The battery module 230 includes a pair of connectors 231a and 231b (collectively referred to as connectors 231), a cell fixture 232, and a diagnostic unit 234. The diagnostic unit 234 can be part of a controller like the controller 140 shown in FIG. 1. In some embodiments, an existing battery management system (BMS), or a portion of a BMS, can be employed as the diagnostic unit 234. The connectors 231 connect the cell fixture 232 and the diagnostic unit 234 to an energy storage system (not shown), which can be, for example, similar to the energy storage system 120 shown in FIG. 1. Thus, the energy storage system is not described in further detail herein and should be considered the same as the energy storage system 120 unless expressly stated otherwise. The connectors 231 can also connect the cell fixtures 232 and the diagnostic unit 234 to a control unit (not shown), which can take the charging states acquired by the diagnostic unit 234 and act correspondingly by adjusting the cell fixtures 232.

The cell fixture 232 is electrically coupled to a plurality of batteries 233(1) to 233(N) (collectively referred as 233), where N is the number of batteries in the cell fixture 232. The cell fixture 232 is configured to connect the plurality of batteries, for example, in series. In some embodiments, the cell fixture 232 can include a plurality of slots, each of which can receive a battery for charging so as to facilitate the insertion and replacement of batteries. In some embodiments, the cell fixture 232 can include fewer slots than the batteries to be charged such that more than one battery may be fitted in a single slot. In some embodiments, the cell fixture 232 can include a plurality of docking stations to receive battery for wireless charging, or inductive charging.

The diagnostic unit 234 (e.g., the BMS) is electrically coupled to the cell fixture 232 and is configured to acquire charging states of each battery in the cell fixture 232. The diagnostic unit 234 includes a voltage monitoring module 234a, a cell balancing module 234b, a state of health (SOH) module 234c, and a temperature monitoring module 234d.

In some embodiments, the voltage module 234a can include a multiplexing architecture, which switches the voltage from each cell in turn to a single analogue or digital output line. Cost savings can be realized by reducing the number of analog control and/or digital sampling circuits. To acquire a near-concurrent voltage state of each cell, a high speed switching mechanism can be used to switch the output line to each cell so that all cells can be monitored before significant voltage change occurs.

In some embodiments, the cell balancing module 234b can include a plurality of switches, each of which can be electrically coupled to a battery in the cell fixture 232. The switches can disconnect certain batteries with a voltage higher than a preset value, or problematic cells or batteries, and direct the charge to the rest of the batteries with relatively lower voltages, therefore achieving active cell balancing.

In some embodiments, the cell balancing module 234b can include a plurality of bypass resistors, each of which can be coupled to a battery in the cell fixture 232. The bypass resistor can remove or dissipate excess energy from certain batteries with a voltage higher than the rest of the batteries, until the rest of the batteries catch up, therefore achieving passive cell balancing. The bypass resistor can also remove excess charge from certain batteries when those batteries are fully charged, until the weaker cells reach full charge, allowing maximum energy storage.

In some embodiments, the cell balancing module 234b can include computer software to realize automated operation. For example, the software can be programmed to increase the rest periods of cells with a higher SOC until the others catch up, thus avoiding overcharge. During discharging, however, the rest periods can be increased for cells with a lower SOC, thus avoiding over-discharging. Since there is no excess charge to dissipate, the method can be lossless.

In some embodiments, the SOH module 234c can include a processor, a memory, and a fuzzy logic circuit to facilitate the acquisition of SOH data. The SOH module 234c can measure several battery factors, including capacity, internal resistance, self-discharge, charge acceptance, discharge capabilities, mobility of electrolyte and cycle counting if possible, to make an estimation of the SOH from a combination of these factors. These raw data can be processed by the processor. For automated measurements and estimation, the initial conditions and the subsequent conditions, also referred to as "experiences", can be stored in the memory. The fuzzy logic circuit can combine the "experiences" and newly measured data to refine the estimation based on a learning process.

In some embodiments, the temperature monitoring module 234d can include an alternating current (AC) source electrically connected to two terminals of each battery. The AC source can perturb the battery's terminals with a low-amplitude AC current and create a phase shift of the resulting voltage output of the battery. The phase shift can be directly related to the temperature of the anode and the cathode of the battery. The temperature monitoring module 234d can measure the internal battery temperature when the battery is under charge, discharge, or rest conditions. In some embodiments, the temperature monitoring module 234d can monitor an overall temperature of the entire cell fixture 232, or the temperature of the air intake or exhaust for battery cooling. In some embodiments, the temperature monitoring module 234d can include a plurality of thermistors that are locally attached at positions near the battery terminals or the battery body to directly measurement the temperature.

Figure 3:
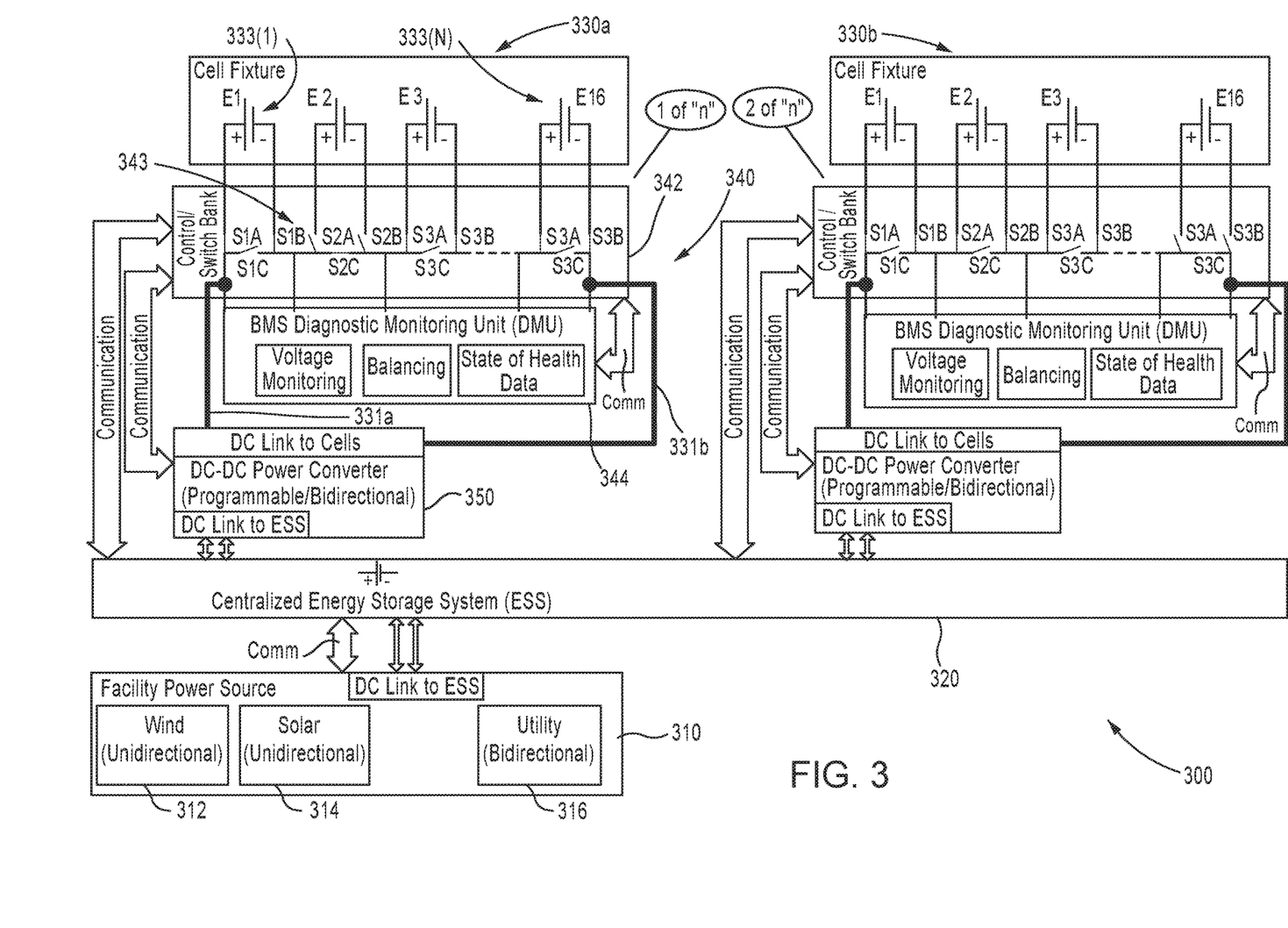
FIG. 3 shows battery formation systems with series batteries, according to various embodiments.

FIG. 3 shows a battery formation system 300 that includes a power source 310, an energy storage system 320, a pair of battery modules 330a and 330b (collectively referred to as 330), a controller 340, and a power converter 350, according to an embodiment. In some embodiments, any number of battery modules 330 and controllers 340 (including a BMS diagnostic unit like the one shown in FIG. 2) can be electrically coupled to the battery formation system 300 (e.g., 3, 4, 5, etc.).

The power source 310 is electrically coupled to the energy storage system 320 and configured to transfer energy from the power source 310 to the energy storage system 320 for battery charging. The power source 310 can include a wind power plant 312, a solar power plant 314, and a utility grid 316. In some embodiments, the wind power plant 312 can transfer energy to the energy transfer system 320 when abundant wind is available but energy demand from utilities is low. Similarly, the solar power plant 314 can transfer energy to the energy storage system 320 during daytime when energy demand is not as high as energy production. The transferred energy can be used for battery formation, or for supplementing the utility grid 316 during night or other times when energy demand exceeds the energy production from the window power plant 312 or solar power plant 316. In some embodiments, the power source 310 can be substantially similar to and/or the same as the power source 110 described above with reference to FIG. 1. Thus, the power source 310 is not described in further detail herein and should be considered the same as the power source 110 unless expressly stated otherwise.

The energy storage system 320 is electrically coupled to the battery modules 330a and 330b, and is configured to allow bi-directional transfer of energy between the energy storage system 320 and the battery modules 330. In one operating state, the energy storage system 320 is configured to transfer energy from the energy storage system 320 to the battery modules 330 to charge the battery modules 330. In a second operating state, the energy storage system 320 is configured to transfer energy from the battery modules 330 to the energy storage system 320 to discharge the battery modules 330. The energy transferred from the battery modules 330 to the energy storage system 320 can be stored for future use including, for example, recharging the battery modules 330 for battery formation or testing. Through recycling the energy from battery discharging, energy consumption for the battery formation system 300, and thus the overall battery manufacturing process, can be reduced.

In some embodiments, the energy storage system 320 can be configured to charge a plurality of battery modules 330 at substantially the same time, and then later discharge the same plurality of battery modules 330. In some embodiments, the energy storage system can be configured to charge a first battery module 330a and discharge a second battery module 330b at substantially the same time.

In some embodiments, the energy storage system 320 can include different energy storage schemes, including battery trailers, flow batteries, electrical double layer capacitors, flywheel energy storage, superconducting magnetic energy storage, thermoelectric energy storage, hydroelectric energy storage, compressed air energy storage, or other energy storage schemes known in the art. The energy storage system 320 can also employ a combination of different energy storage schemes to improve storage efficiency. In some embodiments, the energy storage system 320 can be substantially similar to and/or the same as the energy storage system 120 described above with reference to FIG. 1. Thus, the energy storage system 320 is not described in further detail herein and should be considered the same as the energy storage system 120 unless expressly stated otherwise.

The battery modules 330a and 330b are electrically coupled to the energy storage system, and configured to receive a plurality of batteries 333(1) to 333(N) and connect them in series through a cell fixture 332. In some embodiments, the two battery modules 330a and 330b can have identical structures. In some other embodiments, the two battery modules 330a and 330b can have slightly different structures. For example, the cell fixture 332 in different battery modules can be designed to receive different number, or different type, of batteries.

Each battery module 330 is electrically coupled to a controller 340, which includes two functional units—a control unit 342 and a diagnostic unit 344—to control and monitor charging states of each battery 333 in the battery module 330, respectively. The diagnostic unit 344, which can utilize existing battery management systems (BMS), includes a voltage monitoring module, a balancing module and a SOH module. Data acquired by the diagnostic unit 344 can be used to generate a control signal for the control unit 342. In some embodiments, the control unit 340 includes a plurality of switches 343, each of which is connected to a battery in the battery module 330. In some embodiments, fewer or no switches can be employed to simplify the system.

In some embodiments, the controller 340 is configured to disconnect, through the switches 343, certain batteries from the system when the voltage of those batteries reaches a preset rated voltage. The switches 343 can also direct the charge to the rest of the batteries with lower voltages to achieve active cell balancing. In some embodiments, the controller 340 is configured to temporarily disconnect certain batteries when the voltage of those batteries is higher than the rest of the batteries during charge or lower than the rest of the batteries during discharge. Then the controller 340 can connect back those batteries when the voltage of the rest of the batteries ramps up to a similar level. In some embodiments, the controller 340 can be substantially similar to and/or the same as the controller 140 described above with reference to FIG. 1. Thus, the controller 340 is not described in further detail herein and should be considered the same as the controller 140 unless expressly stated otherwise.

In some embodiments, the battery formation system 300 can include a power converter 350 that is electrically coupled to the energy storage system 320 and the battery module 330, and is configured to adjust a direct current (DC) voltage in the first and second operating states of the energy storage system 320. In the first operating state, when the energy storage system 320 is configured to transfer energy to the battery module 330 to charge the battery module 330, the power converter 350 can receive a voltage from the energy storage system 320 and convert the voltage to another voltage in order to satisfy the charging requirements from the battery module for charging. In a second operating state, when the energy storage system 320 is configured to receive energy from the battery module 330 to discharge the battery module, the power converter 350 can receive a voltage from the battery module 330 and convert the voltage to another voltage in order to fit the specification of the energy storage system 320 for power storage. For example, the energy storage system 320 may have an operating voltage of 200V, while the battery module includes a string of 16 1.5V batteries. The power converter 350 can convert the 200V energy from the energy storage system 320 to 24 V for charging the batteries, and convert the 24V energy from the battery module to 200V in order to store the energy in the energy storage system 320.

In some embodiments, the power converter 350 can be isolated type, in which the two sides of the power converter 350—input side and output side—are isolated by, for example, a magnetic transformer. Isolated type power converter can improve noise reduction and operation safety. In some other embodiments, the power converter 350 can be non-isolated type in order to improve conversion efficiency.

In some embodiments, the power converter 350 can include a soft switching, such as a power metal-oxide-semiconductor field effect transistor (MOSFET), or an insulated gate bipolar transistor (IGBT) in parallel with a diode, so as to achieve switching transition under favorable conditions when the device voltage or current is zero, therefore reducing switching losses. Soft switching can also reduce switch stress, electromagnetic interference (EMI), and/or thermal stress. In some embodiments, the power converter 350 can include an LC tank circuit(s) to shape the load currents and/or voltages to turn on or turn off the converter at zero voltage or zero current, resulting in resonant operation with negligible switching losses.

In some embodiments, the power converter 350 can be programmable so as to control the rise and fall times of the voltage and current. This allows the construction of complex DC transients to implement different charging modes, such as burp charging, trickle charging, or random charging, among others.

In some embodiments, the power converter 350 can include an output interface to deliver an output timing signal. The output timing signal can allow precision event capturing and integration with other devices. For example, the power converter 350 can trigger the utility grid 316, using the output timing signal, to deliver power to the energy storage system 320 when the energy level in the energy storage system drops below a threshold level.

In some embodiments, the power converter 350 can include a voltage identification (VID) control module, which comprises a voltage regulator module (VRM) and a processor. The correct supply voltage can be communicated by the processor to the VRM at startup via a number of bits called VID. In particular, the VRM can initially provide a standard supply voltage to the VID logic, which can be the part of the processor whose function is to then send the VID to the VRM. When the VRM has received the VID identifying the required supply voltage, it can provide the required constant voltage supply to the processor. Instead of having a power supply unit generating some fixed voltage, the processor can use a small set of digital signals, i.e., the VID lines, to instruct an on-board power converter of the desired voltage level.

In some embodiments, the power converter 350 can include a software panel to facilitate user interaction with the power converter 350. For example, the software panel can include advanced Labview graphical control panels, allowing simple and efficient control and data gathering.

In some embodiments, the power converter 350 can include a current sharing module. Current sharing can be an analog control function that fine-tunes the output voltage, so that multiple units may be paralleled when operating in voltage or current priority mode. In this way, models having the same voltage rating can share current equally among participating units. For example, multiple battery modules can share one power converter under current sharing operation.

In some embodiments, the power converter 350 can employ an N+1 redundancy scheme, in which components (N) have at least one independent backup component (+1) to ensure system availability in the event of component failure. The component can be, for example, a transformer or a connector.

In some embodiment, the battery formation system 300 can include a data visualization unit, which can display the charging states or other parameters for operation management. For example, the data visualization unit can show an operator the temperature, voltage, and/or current of each battery in a battery module, such that the operator can identify potential bad or outlier cells. In another example, the data visualization system can display the energy demand from utility grid, therefore allowing an operator to switch the operating state of the energy storage system.

In some embodiments, the battery formation system 300 can include an alert unit, which can take charging states of the batteries and produce an alert signal when charging states of some batteries exceed a safety range. The alert signal can be used to feed the control unit 342, which can, for example, shut down the system during emergency. Or, the alert signal can be an audio or visual signal to remind an operator to respond.

In some embodiments, the battery formation system 300 can include a rework station to fix bad, or "outlier," cells or batteries. The rework station can be operably coupled to the controller 340, such that when the controller 340 identifies a bad or outlier cell, the rework station can take that cell for reworking and then send back the fixed cell to the battery module for charging.

Figure 4:
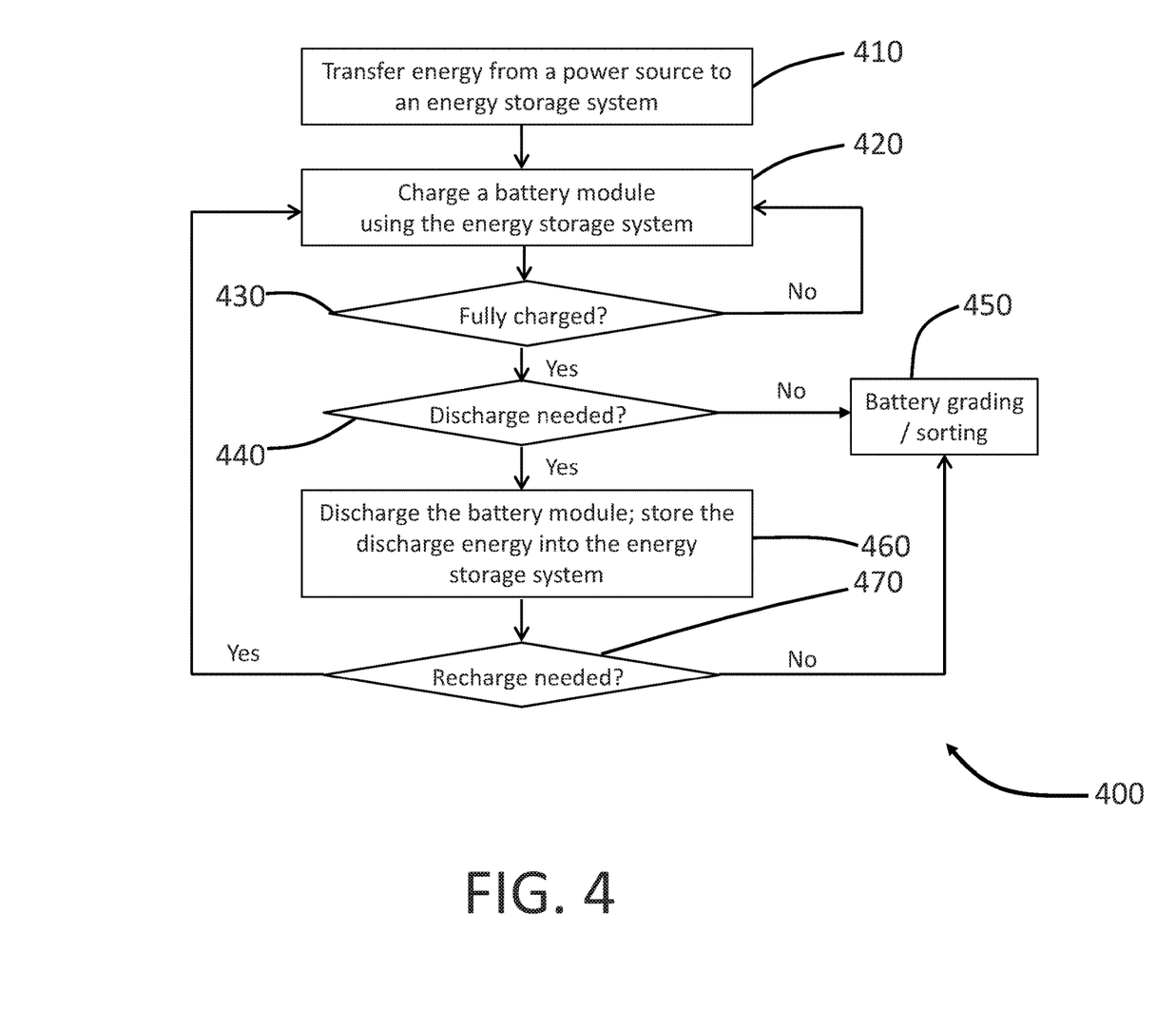
FIG. 4 is a flowchart illustrating methods of battery formation, according to various embodiments.

FIG. 4 shows a battery formation method 400 according to one exemplary embodiment. In this method, a power source is employed to transfer some startup energy to an energy storage system, in step 410, to initiate a battery formation procedure. In step 420, the energy storage system charges a battery module, which can include a plurality of batteries. Charging states of the battery module can be monitored and controlled by a controller, therefore allowing the determination of whether the batteries are fully charged, as in step 430. If the batteries are not fully charged, then the energy storage system can continue charging the battery module. If the batteries are fully charged, the controller then determines in step 440 whether battery discharge is needed due to, for example, requirements from battery formation or testing. If discharge is not needed, the fully charged batteries can be conveyed to next steps, such as battery grading or sorting in step 450. If discharge is needed, the batteries can be discharged in step 460, in which the discharged energy is transferred back to the energy storage system. After discharge, the controller can determines in step 470 whether recharge is necessary for battery formation or test, based on, for example, the state of health (SOH) of the batteries. If so, the batteries can be sent back to step 420, in which the energy storage system charges the batteries using the energy from battery discharge in step 460. If battery recharge is not needed, the batteries can be moved to step 450 for grading or sorting.

In some embodiments, the energy storage system and the controller can be substantially similar to and/or the same as the energy storage system 120 and controller 140 described above with reference to FIG. 1. Thus, the energy storage system and the controller are not described in further detail herein and should be considered the same as the energy storage system 120 and the controller 140 unless expressly stated otherwise.

In some embodiments, the power source can transfer energy to the energy storage system during battery charging or discharging. For example, the power source can provide makeup power to the energy storage system if the controller detects that the amount of energy in the energy storage system drops below a threshold. In another example, during discharge, the controller can estimate the amount of energy to be released from discharge and determine whether the amount of energy is sufficient for next round of battery charging. If not, the controller can direct the power source to transfer supplemental energy to the energy storage system.

Figure 5:
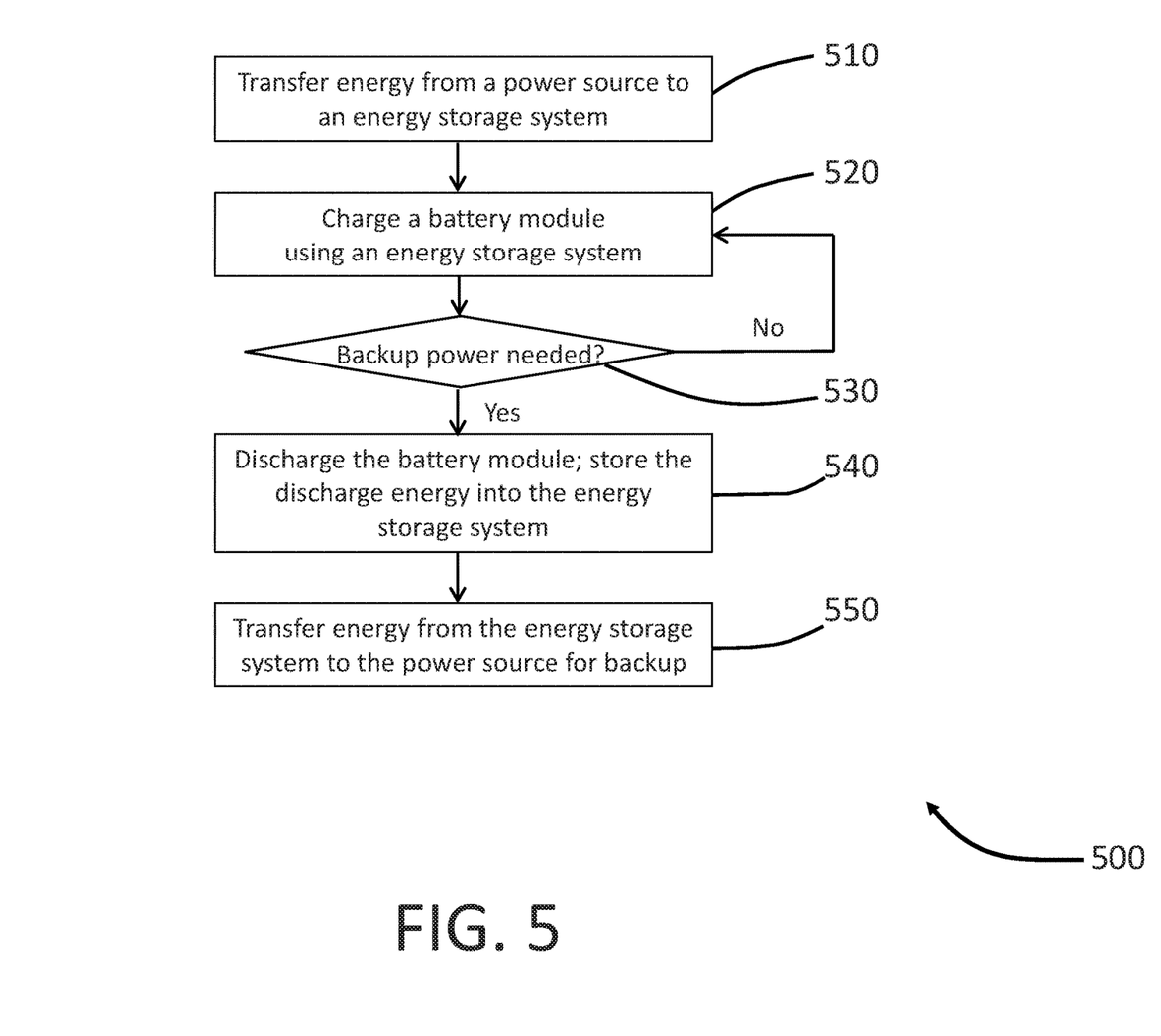
FIG. 5 shows a flowchart illustrating battery formation methods, according to various embodiments.

Referring now to FIG. 5, a battery charging method 500 is provided according to one exemplary embodiment. In the method 500, a power source is employed to transfer energy to an energy storage system, in step 510, to initiate the charging procedure. The energy storage system can then charge a battery module in step 520. During charging, a controller can be employed to monitor charging states of the batteries, as well as any control signal from external utilities, in step 530. If backup power is needed due to, for example, unexpected power outage or low energy production rate of solar power plant in cloudy days, the controller can direct the battery module to discharge the batteries and store the discharged energy in the energy storage system, as in step 540. The energy storage system can then supplement the power source to power external utilities by transferring the stored energy to the power source, in step 550.

In some embodiments, battery charging in step 520 and energy transfer to the power source in step 550 can occur concurrently, provided that the amount of energy stored in the energy storage system is sufficient. For example, the power source can be a solar plant, which can produces abundant energy during daytime while the demand is relatively low. The power source can store the excess energy into the energy storage system for both battery charging and power backup.

Figure 6:
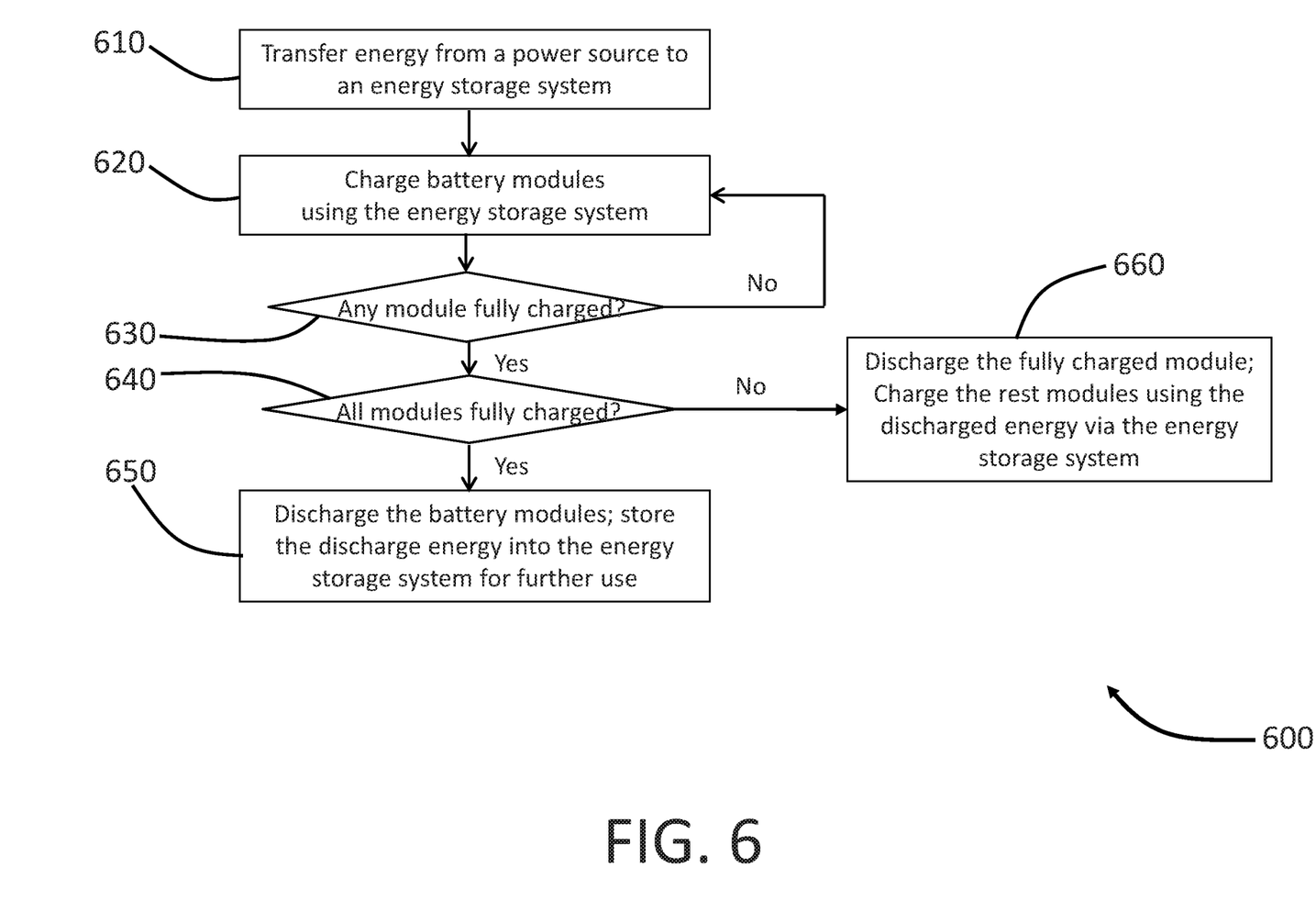
FIG. 6 illustrates battery formation methods for a plurality of battery modules, according to various embodiments.

FIG. 6 shows a battery formation method 600 that includes charging and/or discharging a plurality of battery modules, according to one exemplary embodiment. In this method, a power source is first employed to transfer energy to an energy storage system to initiate the formation procedures in step 610, followed by the charging of a plurality of battery modules using the energy storage system in step 620. A controller is employed to monitor charging states of each battery module and determine whether any battery module is fully charged in step 630. A battery module can be regarded as fully charged when, for example, the voltage is above a preset value. If no fully charged module is found in step 630, the energy storage system can continue charging the battery modules. On the other hand, if one or more modules are fully charged, the controller then determines whether all modules are fully charged in step 640. If so, the controller can direct the battery modules to discharge the batteries and store the discharge energy in the energy storage system as in step 650. If some battery modules are fully charged but not the others, the controller can then direct the battery module to discharge those fully charged battery modules and store the discharge energy in the energy storage system, which can concurrently charge those battery modules that are not fully charged in step 660.

In some embodiments, the controller can selectively discharge and/or charge certain fully charged battery modules in step 650 and/or 660. For example, the controller can monitor the capacity of batteries in each battery module, and terminate the charging/discharging cycles for those battery modules that have a capacity greater than a preset value.

Figure 7:
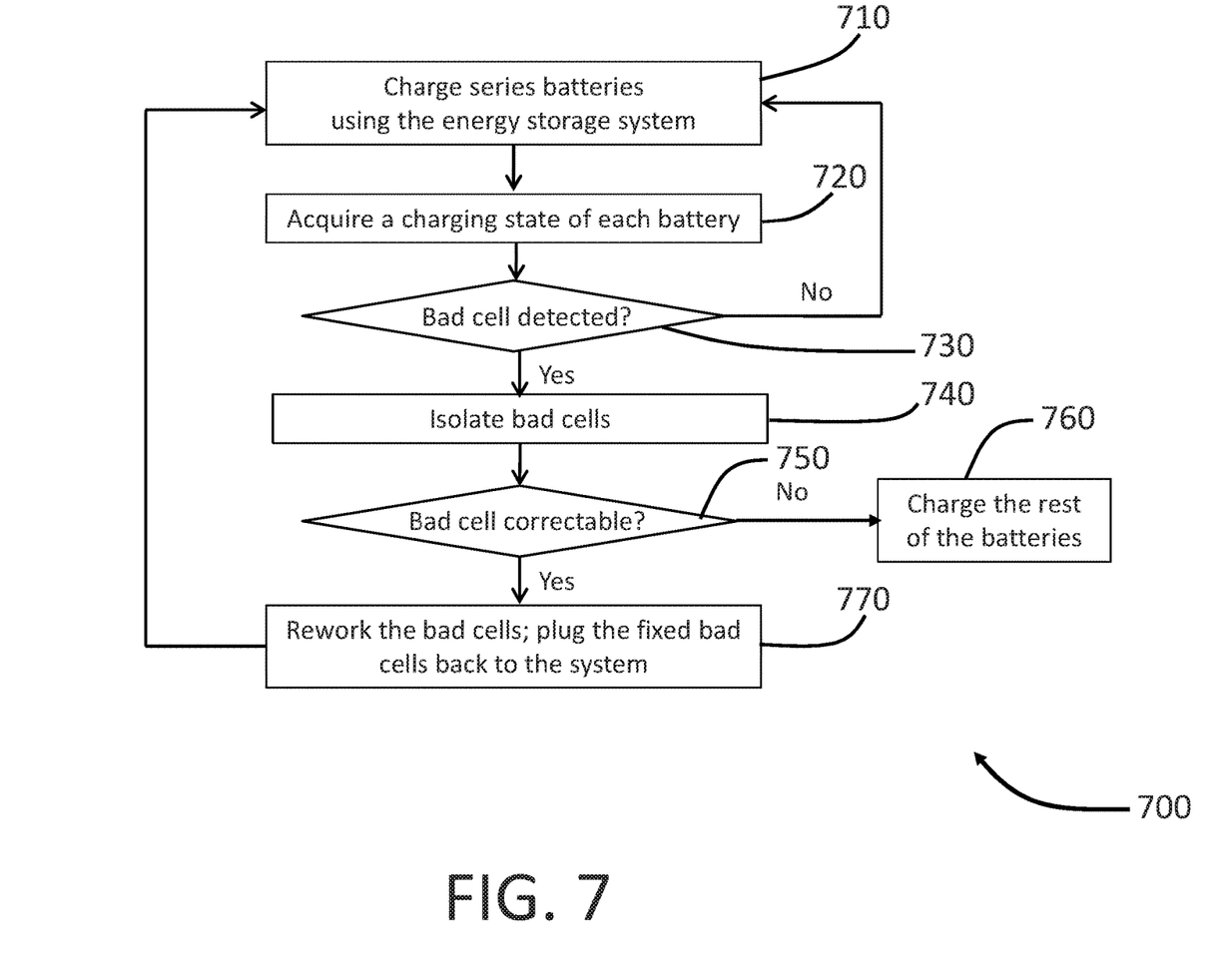
FIG. 7 shows a flowchart of battery formation methods for series batteries, according to various embodiments.

FIG. 7 shows a battery formation method 700 that includes charging a plurality of batteries or battery cells, which can be connected, for example, in series, according to one exemplary embodiment. In this method, an energy storage system is used to charge the series batteries in step 710. A charging state of each battery is monitored by a controller in step 720. Based on the acquired charging states, the controller can identify cells with defects in step 730. If no bad or outlier cell is detected, the energy storage system can keep charging the batteries. In the situation in which the controller identifies certain bad or outlier cells, the controller can then isolate the bad or outlier cells from the rest of the cells in step 740. The bad or outlier cells can be evaluated, in step 750, to determine whether the defects are correctable by a reworking process. If the defects are not correctable, the controller can direct the energy storage system to keep charging the rest of the cells, while removing the bad or outlier cells, in step 760. If, however, the defects are correctable, a rework step can be performed to fix the bad or outlier cells, followed by placing the fixed cells back to the system for charging in step 770.

In some embodiments, the steps 730, 740 and 750 can be performed online without disrupting the battery formation system. For example, the detection of bad or outlier cells can be based on a battery voltage, which can be evaluated via an AC current perturbation method as described before with reference to FIG. 1. In some embodiments, the controller can adjust the output voltage from the energy storage system to accommodate the removal of bad or outlier cells and/or the insertion of fixed cells.

The invention claimed is:

1. A battery formation system comprising:
    a battery module including a plurality of cells, the battery module comprising a diagnostic unit configured to (a) measure a state of charge of the plurality of cells and (b) identify a defective cell from the plurality of cells;
    an energy storage system electrically coupled to the battery module and configured to transfer energy from the energy storage system to the battery module;
    an electrical connection electrically coupling the energy storage system to a power source; and
    a controller operably coupled to the battery module and to the energy storage system, the controller configured to control a charging state of the battery module.

2. The system of claim 1, wherein the transfer of energy from the power source to the energy storage system is based on the amount of energy stored in the energy storage system.

3. The system of claim 1, wherein the diagnostic unit is configured to generate control signals to make adjustments to a rate of energy transfer to the battery module.

4. The system of claim 1, further comprising:
    a power converter electrically coupled to the energy storage system and to the battery module, the power converter configured to adjust a direct current (DC) voltage across the plurality of cells.

5. The system of claim 1, wherein the controller includes a cell balancing module.

6. The system of claim 1, wherein the battery module includes a plurality of batteries connected in series.

7. The system of claim 1, wherein the battery module further includes a cell fixture configured to be electrically coupled to a plurality of batteries, the cell fixture configured to connect the plurality of batteries in a plurality of configurations.

8. The system of claim 7, wherein one of the plurality of configurations is a series configuration.

9. The system of claim 1, wherein the energy storage system is configured to store energy by at least one of: an electrical double-layer capacitor (EDLC), a Li-ion capacitor, a hybrid capacitor, a flywheel, and a superconducting coil.

10. The system claim 1, wherein the diagnostic unit, upon determining that the defective cell cannot be repaired, directs the energy storage system to continue charging the rest of the cells of the plurality of cells.

11. The system of claim 1, wherein the diagnostic unit is configured to repair the defective cell.

12. A battery formation system comprising:
    a plurality of battery modules;
    a diagnostic unit configured to (a) measure a state of charge of a plurality of cells and (b) identify a defective cell from the plurality of cells;
    a centralized energy storage system coupled to the plurality of battery modules, the centralized energy storage system configured to transfer energy from the centralized energy storage system to the plurality of battery modules to charge the plurality of battery modules;
    an electrical connection electrically coupling the centralized energy storage system to a power source; and
    a controller operably coupled to the plurality of battery modules and to the centralized energy storage system, the controller configured to control a charging state of the plurality of battery modules.

13. The system of claim 12, wherein the controller is configured to control a charging state of the centralized energy storage system.

14. The system of claim 12, wherein the energy storage system is configured to store energy with an electrical double-layer capacitor (EDLC), a Li-ion capacitor, a hybrid capacitor, a flywheel, and/or a superconducting coil.

15. The system claim 12 wherein the diagnostic unit, upon determining that the defective cell cannot be repaired, directs the centralized energy storage system to continue charging the rest of the cells of the plurality of cells.

16. A battery formation method, comprising:
    transferring energy from an energy storage system to a battery module to charge the battery module, the battery module including a plurality of cells;
    monitoring a charging state of the battery module with a controller operably coupled to the battery module;
    transferring the energy from the battery module to the energy storage system to discharge the battery module; and
    identifying a defective cell from the plurality of cells.

17. The method of claim 16, wherein energy is transferred from the energy storage system to the battery module during a first time period and the energy is transferred from the battery module to the energy storage system during a second time period.

18. The method of claim 17, wherein at least a portion of the first time period is concurrent with at least a portion of the second time period.

19. The method claim 16, further comprising:
    upon determining that the defective cell cannot be repaired, directing the energy storage system to continue charging the rest of the cells of the plurality of cells.

20. The method of claim 16, further comprising:
    repairing the defective cell.

* * * * *